(12) United States Patent  
Ban et al.

(10) Patent No.: US 9,257,281 B2  
(45) Date of Patent: Feb. 9, 2016

(54) METHODS OF FABRICATING A PATTERN USING THE BLOCK CO-POLYMER MATERIALS

(71) Applicant: SK hynix Inc., Gyeonggi-do (KR)

(72) Inventors: Keun Do Ban, Gyeonggi-do (KR); Cheol Kyu Bok, Gyeongsangbuk-do (KR); Myoung Soo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/326,046

(22) Filed: Jul. 8, 2014

(65) Prior Publication Data

US 2015/0228475 A1 Aug. 13, 2015

(30) Foreign Application Priority Data

Feb. 10, 2014 (KR) .................. 10-2014-0014899

(51) Int. Cl.
*H01L 21/033* (2006.01)
*H01L 21/027* (2006.01)
*H01L 21/308* (2006.01)
*H01L 21/311* (2006.01)

(52) U.S. Cl.
CPC .......... *H01L 21/0337* (2013.01); *H01L 21/027* (2013.01); *H01L 21/308* (2013.01); *H01L 21/31144* (2013.01); *H01L 21/0332* (2013.01)

(58) Field of Classification Search
None
See application file for complete search history.

(56) References Cited

U.S. PATENT DOCUMENTS

2012/0273460 A1* 11/2012 Kang et al. ............ 216/49
2013/0140272 A1* 6/2013 Koole et al. ............ 216/38
2013/0230705 A1 9/2013 Nealey et al.

* cited by examiner

*Primary Examiner* — Stephanie Duclair
(74) *Attorney, Agent, or Firm* — IP & T GROUP LLP

(57) ABSTRACT

A method of fabricating a pattern comprising sequentially forming a pattern formation layer and a neutral layer on over a substrate having in a first regions and a second regions, forming guide patterns on first portions of over the neutral layer in the second regions, forming a first block copolymer layers on over second portions of the neutral layer in the first regions, phase-separating the tint block copolymer layers such that each of the first block copolymer layers includes to form first polymer blocks having a first phase and first polymer blocks having a second phase, removing the guide patterns to form openings that expose the first portions of the neutral layer in the second region, forming a second block copolymer layer on over the phase-separated first block copolymer layers and in the openings, phase-separating the second block copolymer layer into to form second polymer blocks having the first phase and second polymer blocks having the second phase removing the second polymer blocks having the second phase and the first polymer blocks having the second phase, and etching the neutral layer and the pattern formation layer using the first polymer blocks having the first phase and the second polymer blocks having the first phase as an etch masks.

20 Claims, 11 Drawing Sheets

METHODS OF FABRICATING A PATTERN USING THE BLOCK CO-POLYMER MATERIALS

CROSS-REFERENCE TO RELATED APPLICATION

The present application claims priority under 35 U.S.C 119(a) to Korean Application No. 10-2014-0014899, filed on Feb. 10, 2014, in the Korean Intellectual Property Office, which is incorporated herein by reference in its entirety.

BACKGROUND

1. Technical Field

Embodiments of the present disclosure relate to methods of fabricating a pattern using block co-polymer materials.

2. Related Art

Processes and materials for fabricating nano-sized structures are in high demand for development of mechanical, electrical, chemical and biological devices systems) having nano-scale components. Particularly, as nano-scale components are scaled down to tens of nanometers, the need for processes and materials for fabricating nano-sized structures has rapidly increased. Block co-polymer materials are very attractive candidates for use in fabricating nano-sized structures. This is because block co-polymer materials may be self-assembled to form patterns that are tens of nanometers or less.

SUMMARY

Various embodiments are directed to methods of fabricating a pattern using block co-polymer materials.

According to an embodiment, a pattern structure includes a first block copolymer layers disposed over a first region of a substrate and a second block copolymer layer disposed over the first block copolymer layers in the first regions and disposed over the substrate in a second region.

According to an embodiment, a method of fabricating a pattern includes sequentially forming a pattern formation layer and a neutral layer over a substrate in a first region and a second region, forming guide patterns over the neutral layer in the second region, forming a first block copolymer layer over the neutral layer in the first regions, phase-separating the first block copolymer layer to form first polymer blocks having a first phase and first polymer blocks having a second phase, removing the guide patterns to form openings that expose the neutral layer in the second region, forming a second block copolymer layer over the phase-separated first block copolymer layer and in the openings, phase-separating the second block copolymer layer to form second polymer blocks having the first phase and second polymer hocks having the second phase, removing the second polymer blocks having the second phase and the first polymer blocks having the second phase, and etching the neutral layer and the pattern formation layer using the first polymer blocks having the first phase and the second polymer blocks having the first phase as an each masks.

According to an embodiment, a method of fabricating a pattern includes forming a first block copolymer layer over a substrate in a first region, phase-separating the first block copolymer layer to form first polymer blocks having a first phase and first polymer blocks having a second phase, forming a second block copolymer layer over the first polymer blocks having a first phrase and the first polymer blocks having a second phase in the first region, and further forming the second block copolymer layer over the substrate in a second region phase-separating the second block copolymer layer to form second polymer blocks having the first phase and second polymer blocks having the second phase, removing the second polymer blocks having the second phase and the first polymer blocks having the second phase to expose an underlying layer, and patterning the underlying layer using the first polymer blocks having the first phase and the second polymer blocks having the first phase as an etch mask.

According to an embodiment, a method for forming an electronic device comprising forming a first block copolymer layer over a substrate in a first region, phase-separating the first block copolymer layer to form first polymer blocks having a first phase and first polymer blocks having a second phase, forming a second block copolymer layer over the first polymer blocks having a first phase and the first polymer blocks having a second phase in the first region, and further forming the second block copolymer layer over the substrate in a second region, phase-separating the second block copolymer layer to form second polymer blocks having the first phase and second polymer blocks having the second phase, removing the second polymer blocks having the second phase and the first polymer blocks having the second phase to expose an underlying, layer, and patterning the underlying layer using the first polymer blocks having the first phase and the second polymer blocks having the first phase as an etch mask, wherein the electronic device includes a reflective lens of a reflective liquid crystal display (LCD) unit, a polarizing plate for a display panel, a thin film transistor, a color filter substrate, a nano-wire transistor, a memory device, a logic device, a nano-scaled interconnection component, a solar cell, a fuel cell, an etch mask, an organic light emitting diodes (OLEDs), a gas sensor, or an integrated circuit (IC) chip, wherein the integrated circuit (IC) chip includes an IC chip in a raw wafer form, in a bare die form, in a package form, in a single chip package form or in a multi-chip package form, a mother board, or a signal processing device, wherein the single processing device includes a toys, a computer, a display unit, a keyboard, or a central processing unit (CPU), wherein the memory device includes a dynamic random access memory (DRAM) device, a static random access memory (SRAM) device, a flash memory device, a magnetic random access memory (MRAM) device, a phase changeable random access memory (PcRAM) device, a resistive random access memory (ReRAM) device or a ferroelectric random access memory (FeRAM) device, and wherein the logic device includes a controller or a micro processor.

According to an embodiment, an electronic device including a pattern structure, wherein the pattern structure is formed by a method including, forming a first block copolymer layer over a substrate in a first region, phase-separating the first block copolymer layer to form first polymer blocks having a first phase and first polymer blocks having a second phase, forming a second block copolymer layer over the first polymer blocks having a first phase and the first polymer blocks having a second phase in the first region, and further forming the second block copolymer layer over the substrate in a second region, phase-separating the second block copolymer layer to form second polymer blocks having the first phase and second polymer blocks having the second phase, removing the second polymer blocks having the second phase and the first polymer blocks having the second phase to expose an underlying layer, and patterning the underlying layer using the first polymer blocks having the first phase and the second polymer blocks having the first phase as an etch mask, wherein the electronic device includes a reflective lens of a reflective liquid crystal display (LCD) unit, a polarizing plate for a display panel, a thin film transistor, a color filter substrate, a nano-wire transistor, a memory device, a logic device, a nano-scaled interconnection component, a solar cell, a fuel cell, an etch mask, an organic light emitting diode (OLED), a gas sensor, or an integrated circuit (IC) chip, wherein the integrated circuit (IC) chip includes an IC chip in a raw wafer form, in a bare die form, in a package form, in a single chip package form or in a multi-chip package form, a mother board, or a signal processing device, wherein the single processing device includes a toy, a computer, a display unit, a keyboard, or a central processing unit (CPU), wherein the memory device includes a dynamic random access memory (DRAM) device, a static random access memory (SRAM) device, a flash memory device, a magnetic random access memory (MRAM) device, a phase changeable random access memory (PcRAM) device, as resistive random access memory (ReRAM) device or a ferroelectric random access memory (FeRAM) device, and wherein the logic device includes a controller or a micro processor.

According to an embodiment, a pattern formed by a method comprising forming a first block copolymer layer over a substrate in a first region, phase-separating the first block copolymer layer to form first polymer blocks having a first phase and first polymer blocks having a second phase, forming a second block copolymer layer over the first polymer blocks having a first phase and the first polymer blocks having a second phase in the first region, and further forming, the second block copolymer layer over the substrate in a second region, phase-separating the second block copolymer layer to form second polymer blocks having the first phase and second polymer blocks having the second phase, removing the second polymer blocks having the second phase and the first polymer blocks having the second phase to expose an underlying layer, and patterning the underlying layer using the first polymer blocks having the first phase and the second polymer blocks having the first phase as an etch mask.

BRIEF DESCRIPTION OF THE DRAWINGS

Embodiments will become more apparent in view of the attached drawings and accompanying detailed description, in which.

DETAILED DESCRIPTION OF THE EMBODIMENTS

Figure 1:
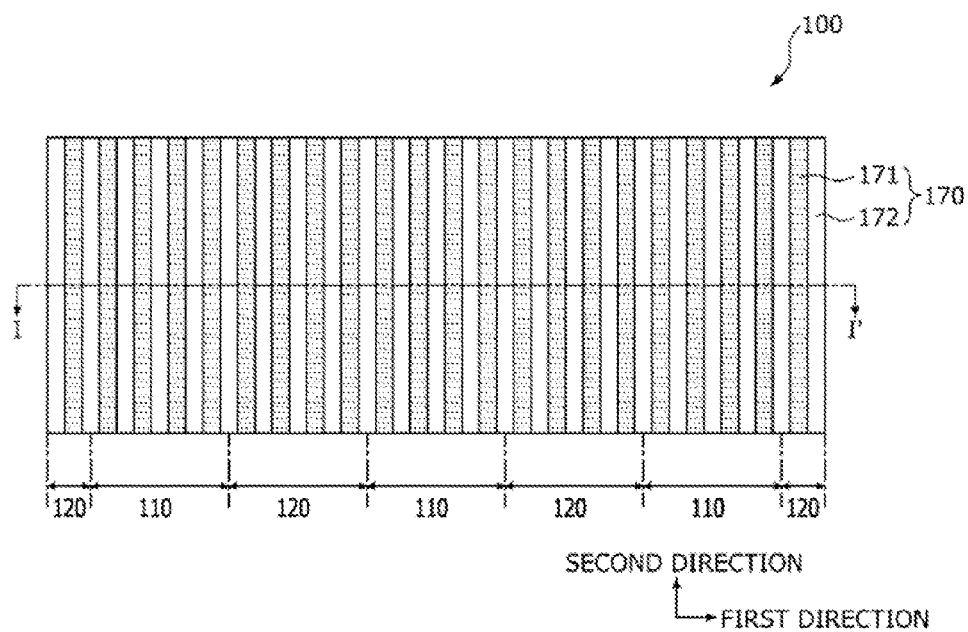
FIG. 1 is a plan view illustrating a pattern structure according to an embodiment.

Photolithography apparatus currently used in formation of integrated circuit patterns may include a photoresist coater, an exposure unit, and a developer Photolithograph apparatus and then photolithography processes have been widely used in fabrication of semiconductor devices because integrated circuit patterns are easily and effectively realized on large substrates in terms of uniformity, registration overlay and geometric shapes of the integrated circuit patterns. However, there may be limitations in improving pattern resolution R using the photolithography process. The pattern resolution R may be expressed by the following Equation 1.

$$R = k1(\lambda/NA) \quad \text{(equation 1)}$$

In Equation 1, "$\lambda$" represents the wavelength of light used in the photolithography apparatus and "NA" represents the numerical aperture of lens Module Constituting the photolithographs apparatus. "k1" is a constant value relating to process parameters. Thus, in order to improve the pattern resolution R, the wavelength $\lambda$ (or the constant value k1) has to be reduced or the numerical aperture NA has to be increased. Attempts to reduce the wavelength $\lambda$ have typically resulted in advanced photolithography processes that use light having a wavelength of about 193 nanometers to form fine patterns in addition, e-beam lithography technologies or extreme ultraviolet (EUV) lithography technologies have been continuously developed to form fine patterns having a critical dimension (CD) or a minimum feature size (MFS) of about 40 nanometers or less, in particular, the EUV ray used in the EUV lithography technologies has a short wave length, about 13.5 nanometers. Thus, EUV lithography technologies are very attractive candidates for next-generation lithography technologies. However, the EUV ray has high photon energy. Thus, the EUV ray may damage the EUV lithography apparatus and reduce the lifetime of the EUV lithography apparatus or it may be difficult to control the exposure energy absorbed into a photoresist layer.

Photoresist materials exhibiting a low and stable line width roughness (LWR) have also been continuously developed to form nano-scale patterns. For example, chemically amplified resist (CAR) materials have been developed to provide nano-scale patterns. The CAR materials may induce generation of acid to sensitively react on light. Accordingly, fine patterns having a minimum feature size of about 50 nanometers can be obtained using the CAR materials. However, the CAR materials are not suitable to form patterns having a size less than 50 nanometers because polymer chains in the CAR materials may be agglomerated or acid molecules generated in the CAR materials may diffuse quickly. This may lead to difficulty in controlling a CD or a line edge roughness (LER) of resist patterns. Moreover, the CAR materials are not suitable to forming fine patterns having a size less than 50 nanometers in that the exposed CAR materials may collapse during a developing step due to strong capillary forces. Thus, methods of forming fine patterns using self-assembly of block co polymer (BCP) materials have been proposed to address these issues.

The BCP materials may have a molecular structure that chemically distinct molecular chains (or polymer blocks) are combined with each other by a covalent bond and there may be a lack of affinity between the molecular chains. Thus, fine-sized phase can be formed using the lack of affinity between the molecular chains. Upon phase separation, each phase may form a fine pattern of about 50 nanometers, more specifically, 10 nanometers or less. In particular, if the BCP materials are used in the lithography processes, two different patterns can be alternately and repeatedly formed on a large substrate. In addition, because self-assembly of the BCP materials used in formation of the nano-scale patterns is achieved by a simple process such as annealing, fabrication cost of the nano-scale patterns may be reduced. Furthermore, since the chemical structure of the BCP material is similar to the photoresist materials which are currently used in fabrication of semiconductor devices, the BCP materials may be easily applied to the fabrication processes of semiconductor devices. Particularly, interface layers between specific phases may be formed with a width of about a few nanometers. Thus, the LWR or the LER of the nano-scale patterns may be reduced.

The following embodiments may provide pattern structures and methods of fabricating fine pattern structures. Each of the pattern structures may include a plurality of patterns which ale repeatedly arrayed in one direction. The embodiments may be applied to realization of various patterns for memory devices or logic devices. In particular, the embodiments may be applied to realization of a layer having protrusion portions and recession portions which are alternately arrayed in a horizontal direction. It also may be applied to realization of patterns disposed on the protrusion portions to serve as mask patterns. The memory devices may include dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices or ferroelectric random access memory (FeRAM) devices. The logic devices may include controllers, microprocessors or the like.

In the following embodiments, it will be understood that when an element is referred to as being located "on", "over", "above", "under", "beneath" or "below" another element, it can be directly contacting the other element, or at least one intervening element may also be present therebetween. Accordingly, the terms such as "on", "over", "above", "under", "beneath", "below" and the like which are used herein are for the purpose of describing particular embodiments only and are not intended to limit other embodiments.

Figure 2:
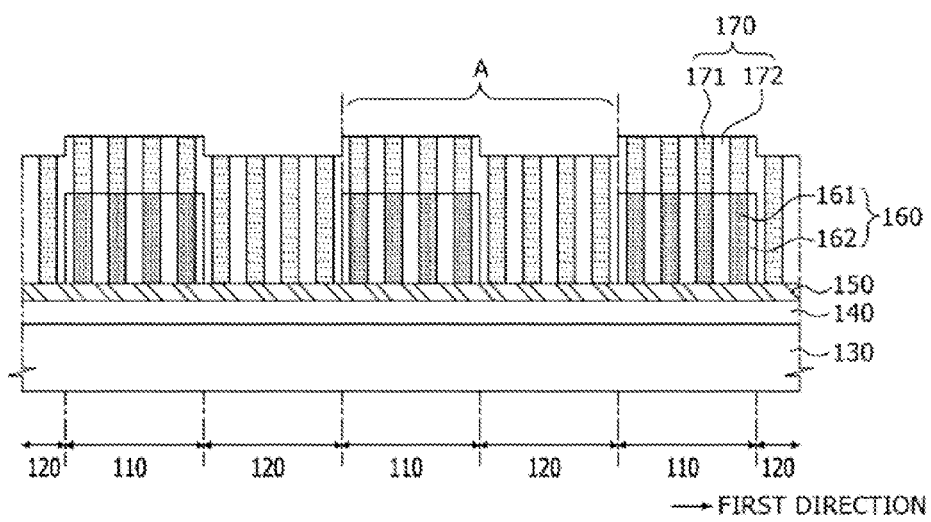
FIG. 2 is a cross-sectional view taken along line I-I' of FIG. 1.

Referring to FIGS. 1 and 2, a pattern structure 100 according, to an embodiment may include a pattern formation layer 140 and a neutral layer 150 stacked on a substrate 130. Although not shown in the drawings, another layer may be disposed between the substrate 130 and the pattern formation layer 140. In some embodiments, the substrate 130 may be a pattern formation layer. The substrate 130 may have first regions 110 and second regions 120. In the instant embodiment, the first regions 110 may extend in a direction perpendicular to a top surface of the substrate 130 to accommodate all material layers stacked on the first regions 110 of the substrate 130. Similarly, the second regions 120 may extend in a direction perpendicular to a top surface of the substrate 130 to accommodate all material layers stacked on the second regions 120 of the substrate 130. That is, for the convenience of description, all the material layers on and over the first regions 110 of the substrate 130 may be described as being disposed in the first regions 110 and all the material layers on and over the second regions 120 of the substrate 130 may be described as being disposed in the second regions 120. The first regions 110 and the second regions 120 may be alternately arrayed in one direction, for example, in a first direction which is parallel with a top surface of the substrate 130. In some embodiments, the substrate 130 may be a semiconductor substrate such as a silicon substrate. Alternatively, the substrate 130 may be an insulation substrate such as a glass substrate. In some embodiments, the pattern formation layer 140 may be a conductive layer or an insulation layer which is subject to patterning to form target patterns in a subsequent process. Alternatively, the pattern formation layer 140 may be a hard mask layer which is used as an etch mask layer. In this case, an underlying layer of the pattern formation layer 140 is further patterned using the patterned pattern formation layer 140. The neutral layer 150 may include a neutral surface having a surface energy of about 38 dyne/cm to about 45 dyne/cm. In some embodiments, the neutral layer 150 may include an organic material.

A first block copolymer layer 160 and a second block copolymer layer 170 may be sequentially stacked on the neutral layer 150 in the respective first region 110. In contrast, only the second block copolymer layer 170 may be stacked on the neutral layer 150 in the respective second region 120. Each of the first block copolymer layers 160 in the first regions 110 may be phase-separated to include first polymer blocks 161 having a first phase and first polymer blocks 162 having a second phase. The first polymer blocks 161 having the first phase and the first polymer blocks 162 having the second phase may be alternately arrayed in the first direction and may extend in a second direction which is substantially perpendicular to the first direction to have stripe shapes. Each of the second block copolymer layers 170 may be phase-separated to include second polymer blocks 171 having the first phase and second polymer blocks 172 having the second phase. In another embodiment, the second block copolymer layers 170 may be phase-separated to form second polymer blocks 171 having a third phase and second polymer blocks 172 having a fourth phase. The second polymer blocks 171 having the first phase and the second polymer blocks 172 having the second phase may be alternately arrayed in the first direction and may extend in the second direction to have stripe shapes. In each first region 110, the second polymer blocks 171 having the first phase may be disposed on the first polymer blocks 161 having the first phase. Likewise, the second polymer blocks 172 having the second phase may be disposed on the first polymer blocks 162 having the second phase.

In some embodiments, the phase-separated first block copolymer layers 160 and the phase-separated second block copolymer layers 170 may include the same block copolymer layer. In such a case, the first polymer blocks 161 having the first phase may include the same polymer block material as the second polymer blocks 171 having the first phase. Similarly, the first polymer blocks 162 having the second phase may include the same polymer block material as the second polymer blocks 172 having the second phase. In some embodiments, each of the first and second block copolymer layers 160 and 170 may be formed of a polystyrene-polymethylmeta acrylate (PS-PMMA) co-polymer material. In such a case, the first polymer blocks 161 having the first phase and the second polymer blocks 171 having the first phase may correspond to polystyrene (PS) blocks, and the first polymer blocks 162 having the second phase and the second polymer blocks 172 having the second phase may correspond to polymethylmeta acrylate (PMMA) blocks.

In other embodiments, the first and second block copolymer layers 160 and 170 may be formed of polybutadiene-polybutylmethacrylate co-polymer, polybutadiene-polydimethylsiloxane co-polymer, polybutadiene-polymethylmethacrylate co-polymer, polybutadienepolyvinylpyridine co-polymer, polybutylacrylate-polymethylmethacrylate co-polymer, polybutylacrylate-polybinylpyridine co-polymer polyisoprene-polyvinylpyridine co-polymer, polyisoprene-polymethylmethacrylate co-polymer, polyhexylacrylatepolyvinylpyridine co-polymer, polyisobutylene-polybutylmethacrylate co-polymer, polyisobutylene-polymethyl methacrylate co-polymer, polyisobutylene-polybutylmethacrylate co-polymer, polyisobutylenepolydimethylsiloxane co-polymer, polybutylmethacrylatepolybutylacrylate co-polymer, polyethylethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinyl pyridine co-polymer, polyethylethylene-polyvinylpyridine co-polymer polyethylene-polyvinylpyridine co-polymer, polyvinylpyridinepolymethylmethacrylate co-polymer, polyethyleneoxide-polyisoprene co-polymer, polyethyleneoxide-polybutadiene co-polymer, polyethyleneoxide-polystyrene co-polymer, polyethyleneoxidepolymethylmethacrylate co-polymer, polyethyleneoxide-polydimethylsiloxane co-polymer, or polystyrene-polyethyleneoxide co-polymer.

Figure 3:
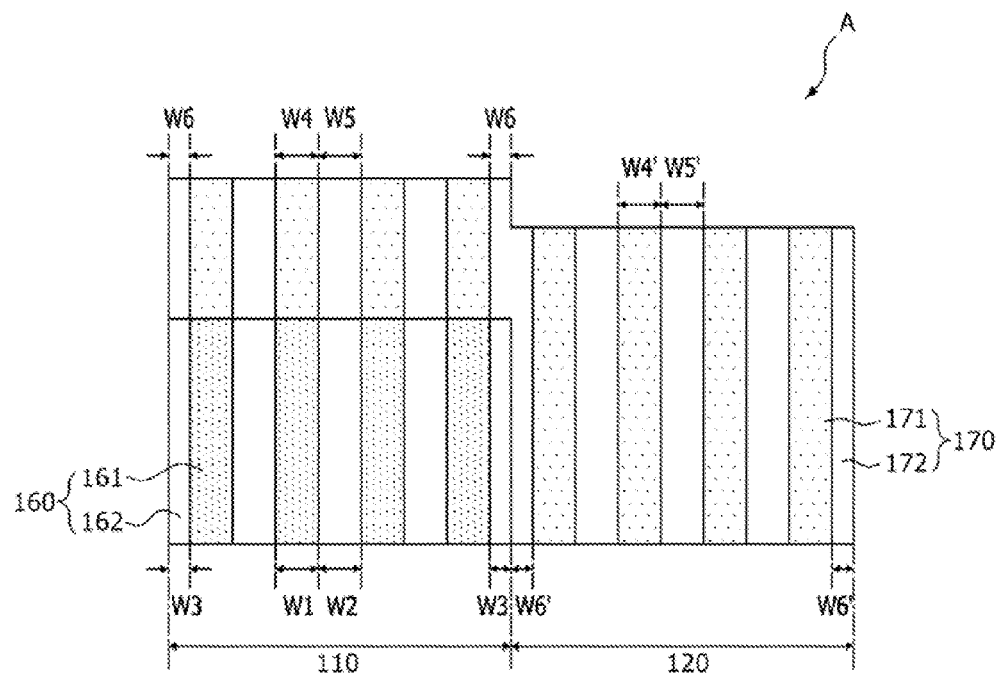
FIG. 3 is an enlarged view illustrating a portion 'A' of FIG. 2.

Referring to FIGS. 2 and 3, the first polymer blocks 161 having the first phase and the first polymer blocks 162 having the second phase may be alternately arrayed in the first region 110. The first polymer blocks 161 having the first phase and the first polymer blocks 162 having the second phase may be arrayed in the first region 110 such that the first polymer blocks 162 having the second phase are respectively disposed at both edges of the first region 110 adjacent to the second regions 120. The second block copolymer layers 170 may be disposed such that the second polymer blocks 171 having the first phase are aligned with the first polymer blocks 161 having the first phase and the second polymer blocks 172 having the second phase are aligned with the first polymer blocks 162 having the second phase. Thus, the second polymer blocks 172 having the second phase may be stacked on the first polymer blocks 162 having the second phase which are disposed at both edges of the first region 110 adjacent to the second regions 120. The second polymer blocks 171 having the first phase and the second polymer blocks 172 having the second phase may be arrayed in the second region 120 such that the second polymer blocks 172 having the second phase are disposed at edges of the second region 110 adjacent to the first regions 110.

In some embodiments, a width W1 of the first polymer blocks 161 having the first phase may be substantially equal to a width W2 of the first polymer blocks 162 having the second phase. Accordingly, a width W4 of the second polymer blocks 171 having the first phase arrayed in the first and second regions 110 and 120 may also be substantially equal to a width W5 of the second polymer blocks 172 having the second phase arrayed in the first and second regions 110 and 120. A width W3 of the first polymer blocks 162 having the second phase and disposed at edges of the first region 110 may be substantially half of the width W2 of the first polymer blocks 162 having the second phase disposed in an inner portion of the first region 110. Thus, each of the first regions 110 may have a width of (2×N'×W'). In the width of (2×N'×W'), N' denotes the number of the first polymer blocks 161 having the first phase and disposed in the first region 110. W' denotes the width W1 of the first polymer blocks 161 having the first phase and disposed in the first region 110 for the width W2 of the first polymer blocks 162 having the second phase and disposed in an inner portion of the first region 110). Because the second polymer blocks 171 having the first phase are aligned with the first polymer blocks 161 having the first phase and the second polymer blocks 172 having the second phase are aligned with the first polymer blocks 162 having the second phase, a width W6 of the second polymer blocks 172 having, the second phase and disposed at edges of the first region 110 may also be substantially half of the width W2 of the second polymer blocks 172 having the second phase and disposed in an inner portion of the first region 110.

A width W4' of the second polymer blocks 171 having the first phase and disposed in the second region 120 may be substantially equal to the width W4 of the second polymer blocks 171 having the first phase and disposed in the first region 110, and a width W5" of the second polymer blocks 172 having the second phase and disposed in the second region 120 may be substantially equal to the width W5 of the second polymer blocks 172 having the second phase and disposed in the first region 110. A width W6' of the second polymer blocks 172 having the second phase and disposed at edges of the second region 120 may be substantially half of the width W5' of the second polymer blocks 172 having the second phase and disposed in an inner portion of the second region 120. In such a case, each of the second regions 120 may have a width of (2×N"×W"). In the width of (2×N"×W"), N" denotes the number of the second polymer blocks 171 having the first phase and disposed in the second region 120. W" denotes the width W4' of the second polymer blocks 171 having the first phase and disposed in the second region 120 (or the width W5' of the second polymer blocks 172 having the second phase and disposed in an inner portion of the second region 120). Because the second polymer blocks 171 having the first phase are aligned with the first polymer blocks 161 having the first phase and the second polymer blocks 172 having the second phase are aligned with the first polymer blocks 162 having the second phase, a width W6' of the second polymer blocks 172 having the second phase and disposed at edges of the second region 120 may also be substantially half of the width W5' of the second polymer blocks 172 having the second phase and disposed in an inner portion of the second region 120.

Figure 4:
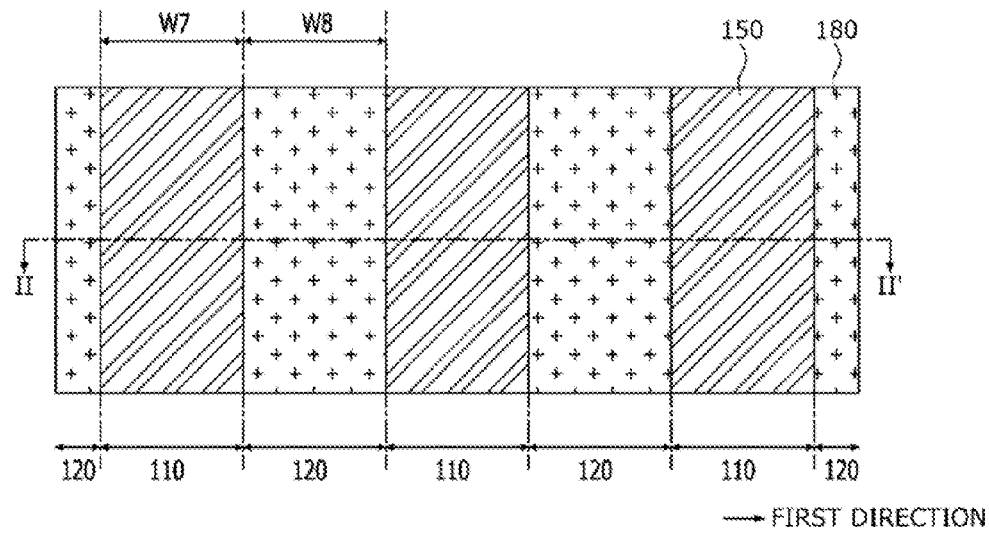
FIGS. 4, 6, 8, 10, 12, 14, 16, 18 and 20 are plan views illustrating a method of fabricating a pattern structure according to an embodiment.
Figure 5:
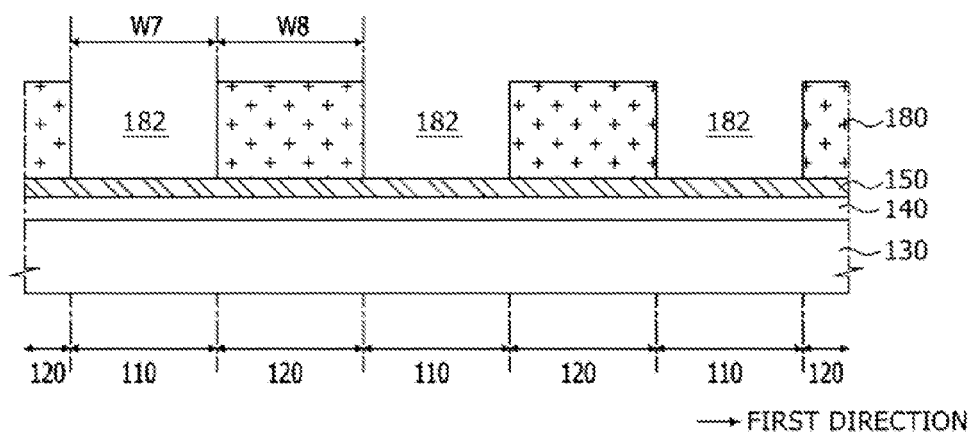
FIGS. 5, 7, 9, 11, 13, 15, 17, 19 and 21 are cross-sectional views taken along lines II-II' of FIGS. 4, 6, 8, 10, 12, 14, 16, 18 and 20, respectively.

Referring to FIGS. 4 and 5, a pattern formation layer 140 may be formed on a substrate 130 and a neutral layer 150 may be formed on the pattern formation layer 140. The substrate 130 may have first regions 110 and second regions 120. In an embodiment, the first regions 110 may extend in a direction perpendicular to a top surface of the substrate 130 to accommodate all material layers which are formed on and over the first regions 110 of the substrate 130 in subsequent processes. Similarly, the second regions 120 may extend in a direction perpendicular to a top surface of the substrate 130 to accommodate all material layers which are formed on and over the second regions 120 of the substrate 130 in subsequent processes. That is, all the material layers formed on and over the first regions 110 of the substrate 130 may be regarded as being disposed in the first regions 110 and all the material layers formed on and over the second regions 120 of the substrate 130 may be regarded as being disposed in the second regions 120. The first regions 110 and the second regions 120 may be alternately arrayed in one direction for example, in a first direction which is parallel with a top surface of the substrate 130. In some embodiments, the substrate 130 may be a semiconductor substrate such as a silicon substrate or an insulation substrate such as a glass substrate. The pattern formation layer 140 may be patterned to form target patterns in a subsequent process. However, in some embodiments, the pattern formation layer 140 may be used as a hard mask layer. In that case, an underlying layer of the pattern formation layer 140 is farther patterned using the patterned pattern formation layer 140. In such a case, at least one layer may be additionally formed between the substrate 130 and the pattern formation layer 140. The neutral layer 150 may include a material layer whose surface energy is about 48 dyne/cm to about 45 dyne/cm. In some embodiments, the neutral layer 150 may include an organic material.

A guide layer may be formed on the neutral layer 150. The guide layer may be formed to include guide patterns 180 that are disposed in the respective second regions 120 to define first openings 182 exposing the neutral layer 150 in the first regions 110. In some embodiments, the guide layer may be formed such that a width W8 of the guide patterns 180 is equal to a width W7 of the first openings 182. Alternatively, the guide layer may be formed such that the width W8 of the guide patterns 180 is different from the width W7 of the first openings 182. The width W7 of the first openings 182 and the width W8 of the guide patterns 180 may be determined according to specific process conditions which are described in subsequent process steps.

In some embodiments, the guide patterns 180 may include a negative photoresist layer. In such as case, the guide patterns 180 including the negative photoresist layer may be acidified through an exposure step and a development step. Alternatively, the guide patterns 180 may include a positive photoresist layer. In such a case, the guide patterns 180 may be additionally subjected to a blank exposure step to have acidified states. If the guide patterns 180 are acidified, in a subsequent process, the guide patterns 180 may preferentially react on one of two types of polymer blocks which are in two different phases, respectively, and are formed in the first regions 110.

Figure 6:
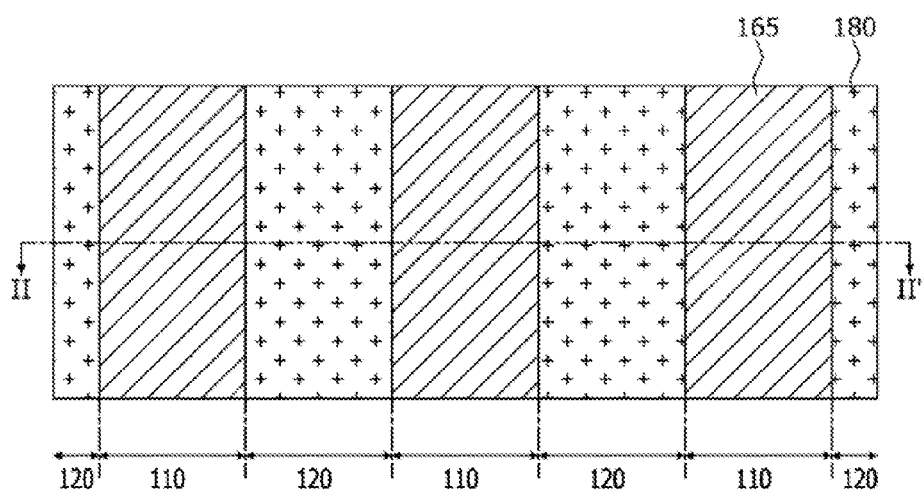
Figure 7:
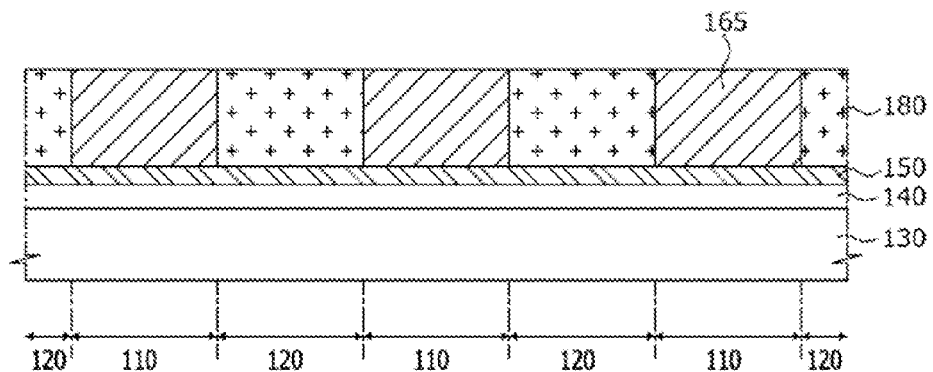

Referring to FIGS. 6 and 7, the first block copolymer layers 165 may be formed on the neutral layer 150 exposed between the guide patterns 180 and formed in the first regions 110. In some embodiments, the first block copolymer layers 165 may be formed using a spin coating process. Each of the first block copolymer layers 165 may include copolymer blocks. Each copolymer blocks includes two different types of polymers which are covalently bonded. The volume ratio of the two different types of polymers may be about 1:1. In the present embodiment, the first block copolymer layers 165 may be formed of a polystyrene-polymethylmeta acrylate (PS-PMMA) block co-polymer. Each block may include polystyrene (PS) and polymethylmeta acrylate (PMMA) which are combined with covalent bonding. However, the PS-PMMA co-polymer is merely an example of suitable materials for the first block copolymer layers 165. In some embodiments, the first block copolymer layers 165 may include polybutadiene-polybutylmethacrylate co-polymer, polybutadiene-polydimethylsiloxane co-polymer, polybutadiene-polymethylmethacrylate co-polymer, polybutadienepolyvinylpyridine co-polymer, polybutylacrylate-polymethylmethacrylate co-polymer, polybutylacrylate-polyvinylpyridine co-polymer, polyisoprene-polyvinylpyridine co-polymer, polyisoprene-polymethylmethacrylate co-polymer, polyhexylacrylate-polyvinylpyridine co-polymer, polyisobutylene-polybutylmethacrylate co-polymer, polyisobutylene-polymethylmethacrylate co-polymer polyisobutylene-polybutylmethacrylate co-polymer, polyisobutylenepolydimethylsiloxane co-polymer, polybutylmethacrylatepolybutylacrylate co-polymer, polyethylethylene-polymethylmethacrylate co-polymer, polystyrene-polybutylmethacrylate co-polymer polystyrene-polybutadiene co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyvinylpyridine co-polymer, polyvinylpyridinepolymethylmethacrylate co-polymer, polyethyleneoxide-polyisoprene co-polymer, polyethyleneoxide-polybutadiene co-polymer polyethyleneoxide-polystyrene co-polymer, polyethyleneoxidepolymethylmethacrylate co-polymer, polyethyleneoxide-polydimethylsiloxane co-polymer, polystyrene-polyethyleneoxide co-polymer, or a combination thereof.

Figure 8:
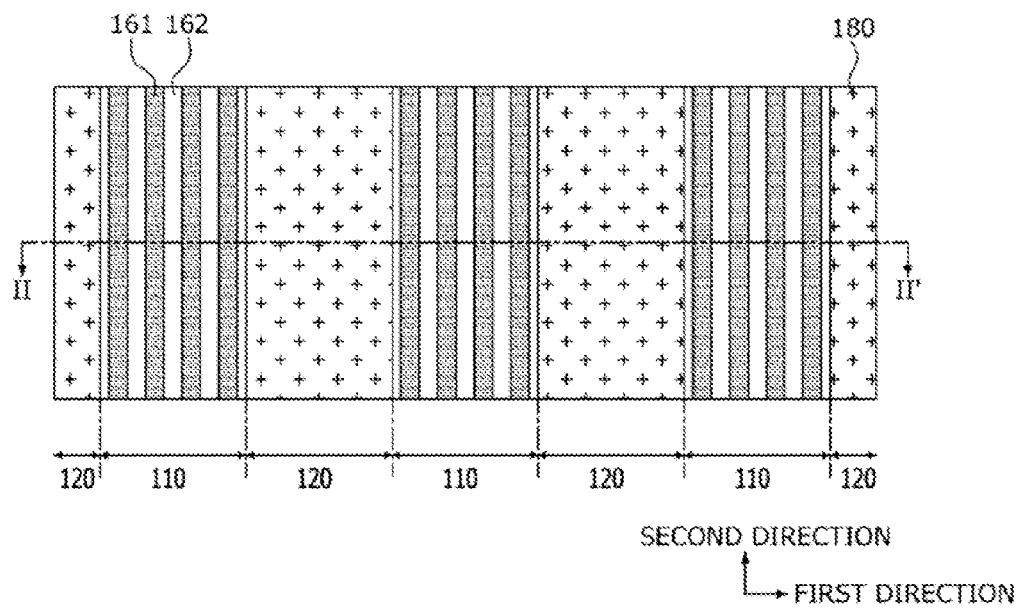
Figure 9:
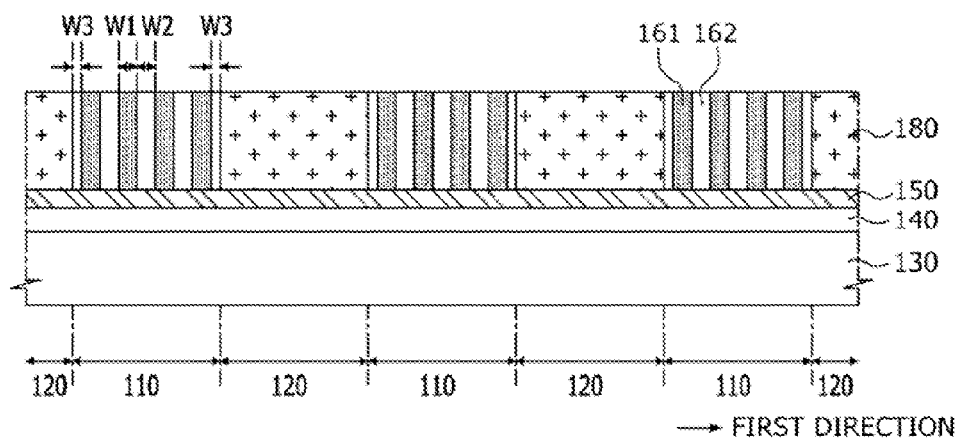

Referring to FIGS. 8 and 9, the first block copolymer layers (165 of FIGS. 6 and 7) may be phase-separated into first polymer blocks 161 having a first phase and first polymer blocks 162 having a second phase. The phase separation of the first block copolymer layers 165 may be achieved by an annealing process. If the first block copolymer layers 165 are formed of a PS-PMMA co-polymer material, each of the first block copolymer layers 165 may be phase-separated into PS blocks (corresponding to the first polymer blocks 161 having the first phase) and PMMA blocks (corresponding to the first polymer blocks 162 having the second phase) by an annealing process. The first polymer blocks 161 having the first phase and the first polymer blocks 162 having the second phase may be alternately arrayed in the first direction and may extend in a second direction perpendicular to the first direction to have stripe shapes. A width W1 of each of the first polymer blocks 161 having the first phase may be determined according to the polymerization degree of the first polymer blocks 161 having the first phase, and a width W2 of each of the first polymer blocks 162 having the second phase may be determined according to the polymerization degree of the first polymer blocks 162 having the second phase. In some embodiments, the polymerization degree of the first polymer blocks 161 having the first phase and the first polymer blocks 162 having the second phase may be controlled such that the width W1 of each of the first polymer blocks 161 having the first phase is substantially equal to the width W2 of each of the first polymer blocks 162 having the second phase.

If the first, block copolymer layers 165 include a PS-PMMA co-polymer material and the guide patterns 180 include an acidified photoresist layer, the first polymer blocks 162 having the second phase may be formed at both sides of each guide pattern 180. Thus, the first polymer blocks 162 having the second phase may be formed at both sides of each of the first regions 110, and the first polymer blocks 161 having the first phase and the first polymer blocks 162 having the second phase may be alternately arrayed in an inner portion of each of the first regions 110. If the first block copolymer layers (165 of FIGS. 6 and 7) is phase-separated such that the width W1 of each of the first polymer blocks 161 having the first phase is substantially equal to the width W2 of each of the first polymer blocks 162 having the second phase, a width of each of the first regions 110 (i.e., the width W7 of each of the first openings 182 shown in FIGS. 4 and 5) may have a value of (2×N'×W'). In the width of (2×N'×W') denotes the number of the first polymer blocks 161 having the first phase and disposed in each of the first regions 110 and W' corresponds to the width W1 of the first polymer blocks 161 having the first phase and disposed in each of the first regions 110 (or the width W2 of the first polymer blocks 162 having the second phase disposed in an inner portion of each of the first regions 110). Accordingly, a width W3 of the first polymer blocks 162 having the second phase and disposed at edges of each of the first regions 110 may be substantially half of the width W2 of the first polymer blocks 162 having the second phase and disposed in an inner portion of each of the first regions 110.

Figure 10:
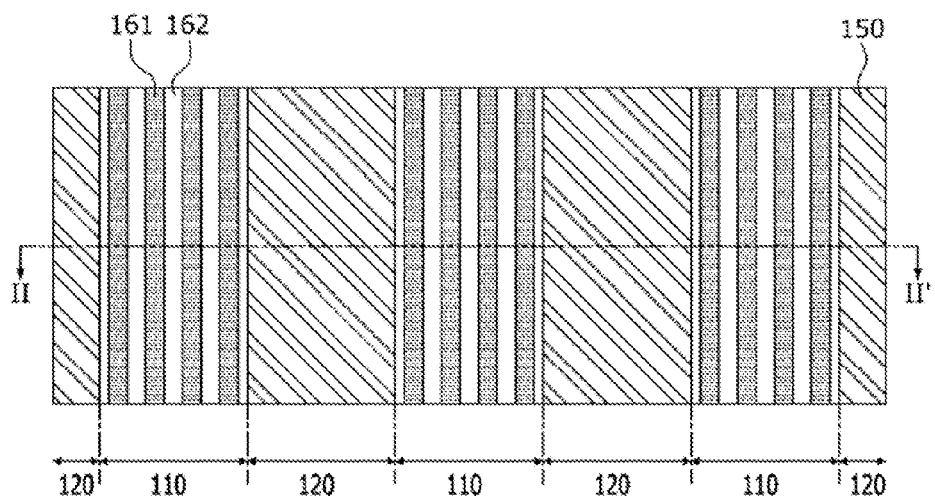
Figure 11:
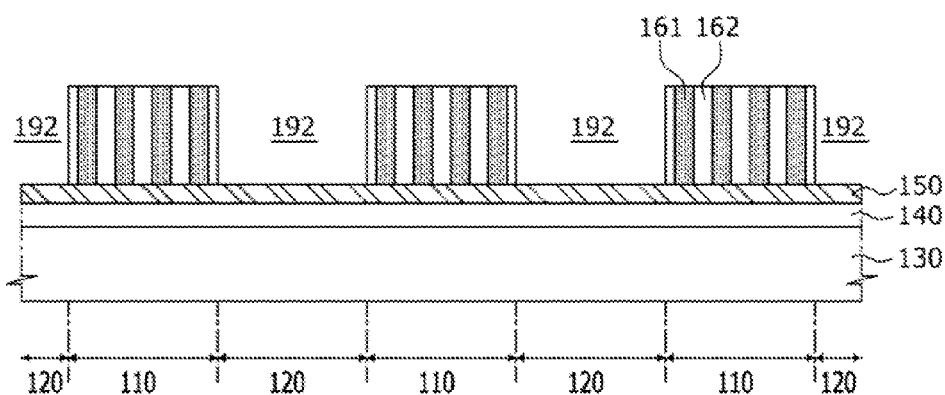

Referring to FIGS. 10 and 11, the guide patterns (180 of FIGS. 8 and 9) may be removed. If the guide patterns 180 include a photoresist layer, the guide patterns 180 may be removed using a photoresist developer, for example, a tetramethyl-ammonium-hydroxide (TMAH) solution. Removal of the guide patterns 180 may provide second openings 192 that expose portions of the neutral layer 150 in the second regions 120. The second openings 192 may expose the first polymer blocks 162 having the second phase and disposed at edges of the first regions 110.

Figure 12:
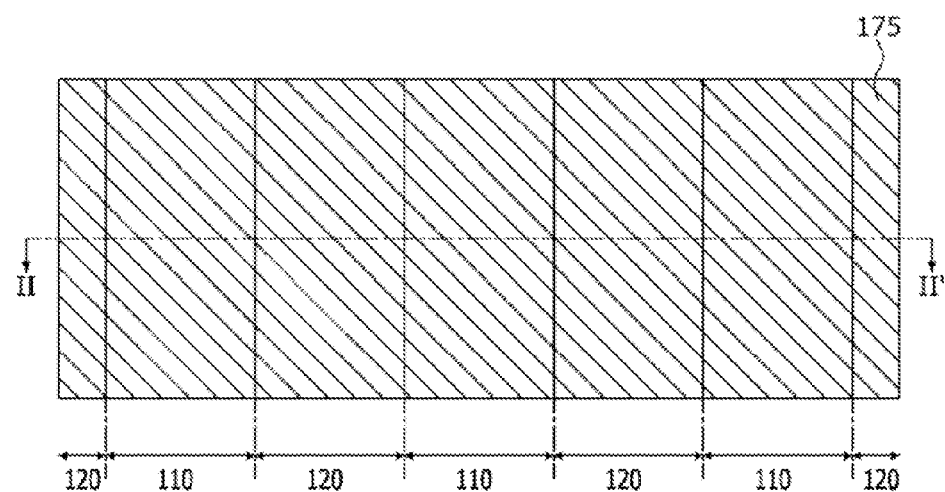
Figure 13:
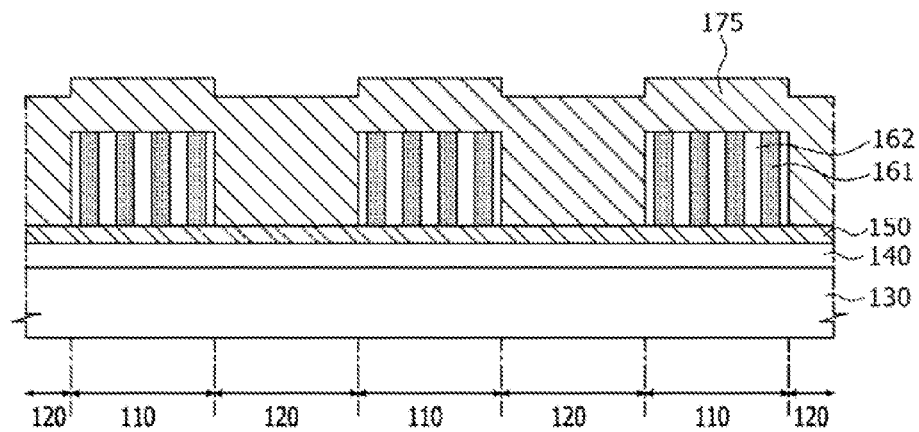

Referring to FIGS. 12 and 13, a second block copolymer layer 175 may be formed on the first polymer blocks 161 and 162 phase-separated in the first regions 110 and the portions of the neutral layer 150 exposed by the second openings 192. In some embodiments, the second block copolymer layer 175 may be formed using a spin coating process. The second block copolymer layer 175 may include copolymer blocks. Each copolymer block includes two different types of polymers which are covalently bonded. In such a case, the volume ratio of the two different types of polymers may be about 1:1. In the present embodiment, the second block copolymer layer 175 may be formed of a polystyrene-polymethylmeta acrylate (PS-PMMA) co-polymer material. Each block may include polystyrene (PS) and polymethylmeta acrylate (PMMA) which are covalently bonded. However, the PS-PMMA co-polymer material is merely an example of suitable materials for the second block copolymer layer 175. In some embodiments, the second block copolymer layer 175 may include polybutadiene-polybutylmethacrylate co-polymer, polybutadiene-polydimethylsiloxane co-polymer, polybutadiene-polymethylmethacrylate co-polymer, polybutadienepolyvinylpyridine co-polymer, polybutylacrylate-polymethylmethacrylate co-polymer, co-polymer, polybutylacrylate-polyvinylpyridine co-polymer polyisoprene-polyvinylpyridine co-polymer, polyisoprene-polymethylmethacrylate co-polymer, polyhexylacrylatepolvinylpyrine co-polymer, polyisobutylene-polybutylmethacrylate co-polymer, polyisobutylene-polymethylmethacrylate co-polymer, polyisobutylene-polybutylmethacrylate co-polymer, polyisobutylenepolydimethylsiloxane co-polymer, polybutylmethacrylatepolybutylacrylate co-polymer, polyethylethylene-polymethylmethacrylate co-polymer, polystyrene-polybutylmethacrylate co-polymer, polystyrene-polybutadiene co-polymer, polystyrene-polyisoprene co-polymer, polystyrene-polydimethylsiloxane co-polymer, polystyrene-polyvinylpyridine co-polymer, polyethylethylene-polyvinylpyridine co-polymer, polyethylene-polyethyleneoxide-polyisoprene co-polymer, polyethyleneoxide-polybutadiene co-polymer, polyethyleneoxide-polystyrene co-polymer polyethyleneoxidepolymethylmethacrylate co-polymer, polyethyleneoxide-polydimethysiloxane co-polymer, polystyrene-polyethyleneoxide co-polymer, or a combination thereof. The second block copolymer layer 175 may include the same material as the first block copolymer layers 165.

Figure 14:
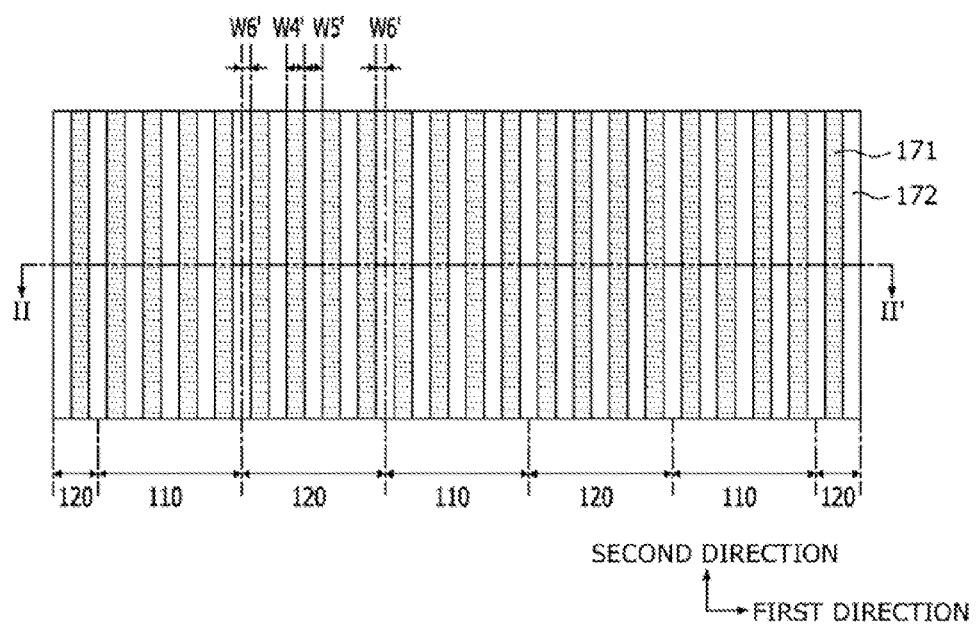
Figure 15:
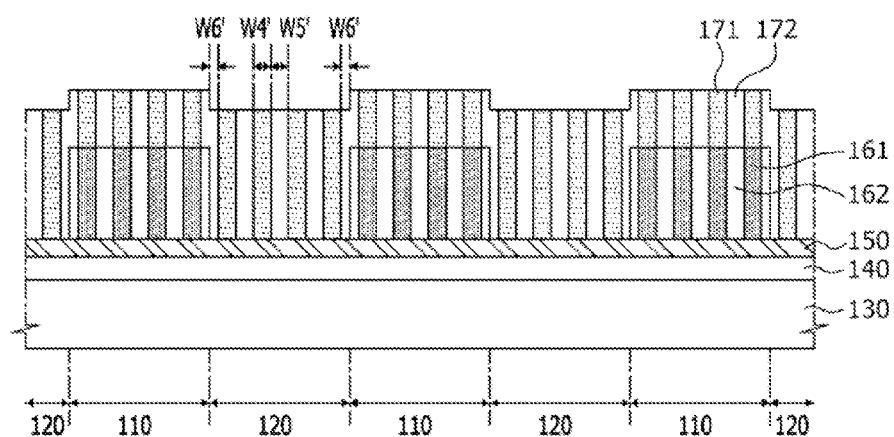

Referring to FIGS. 14 and 15, the second block copolymer layer 175 of FIGS. 12 and 13) may be phase-separated into second polymer blocks 171 having the first phase and second polymer blocks 172 having the second phase. The phase separation of the second block copolymer layer 175 may be achieved by an annealing process. If the second block copolymer layer 175 is formed of a PS-PMMA co-polymer material, the second block copolymer layer 175 may be phase-separated into PS blocks (corresponding to the second polymer blocks 171 having the first phase) and PMMA blocks (corresponding to the second polymer blocks 172 having the second phase) by an annealing process.

If the first and second block copolymer layers 165 and 175 are formed of the same material, the second polymer blocks 171 having the first phase may be formed to be vertically aligned with the respective first polymer blocks 161 having the first phase in the first regions 110. Likewise, the second polymer blocks 172 having the second phase may be formed to be vertically aligned with the respective first polymer blocks 162 having the second phase in the first regions 110. Accordingly, the second polymer blocks 171 having the first phase and the second polymer blocks 172 having the second phase may be alternately arrayed in the first direction in the first regions 110 and may extend in the second direction perpendicular to the first direction to have stripe shapes like the first polymer blocks 161 having the first phase and the first polymer blocks 162 having the second phase formed in the first regions 110. Moreover, the second polymer blocks 172 having the second phase may be formed at edges of each of the first regions 110.

Even in the second regions 120, the second polymer blocks 171 having the first phase and the second polymer blocks 172 having the second phase may be alternately arrayed in the first direction and may extend in the second direction to have stripe shapes like the second polymer blocks 171 having the first phase and the second polymer blocks 172 having the second phase formed in the first regions 110. Because the first polymer blocks 162 and the second polymer blocks 172 stacked on the first polymer blocks 162 are formed at edges of each of the first regions 110, the second polymer blocks 172 having the second phase may also be formed at edges of each of the second regions 120. If a width W4' of the second polymer blocks 171 having the first phase formed in the second regions 120 may be substantially equal to a width W5' of the second polymer blocks 172 having the second phase formed in the second regions 120, a width of each of the second regions 120 (i.e., each of the guide patterns 180 shown in FIGS. 4 and 5) may have a value of (2×N'×W"). In the value of (2×N"×W"), N" denotes the number of the second polymer blocks 171 having the first phase and formed in each of the second regions 120 and W" corresponds to the width W4' of the second polymer blocks 171 having the first phase and formed in the second regions 120 (or the width W5' of the second polymer blocks 172 having the second phase formed in inner portions of the second regions 120). Thus, a width W6' of the second polymer blocks 172 having the second phase formed at edges of each of the second regions 120 may be substantially half of the width W5' of the second polymer blocks 172 having the second phase formed in inner portions of the second regions 120.

Figure 16:
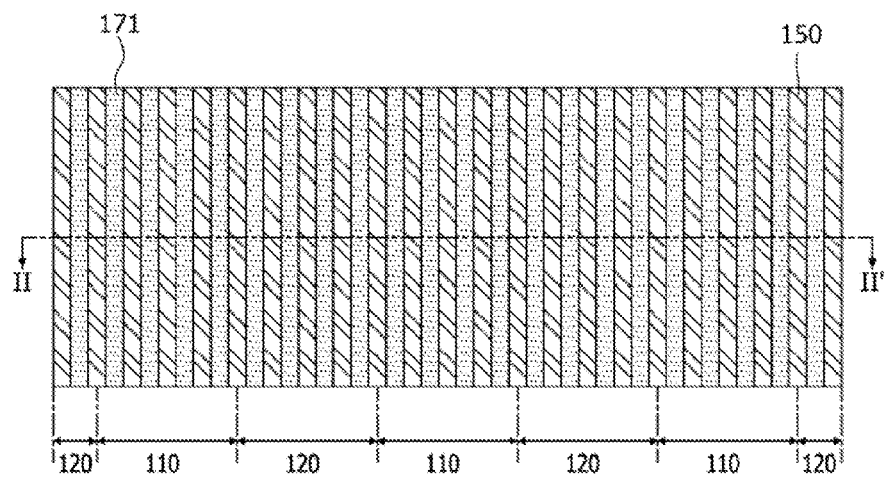
Figure 17:
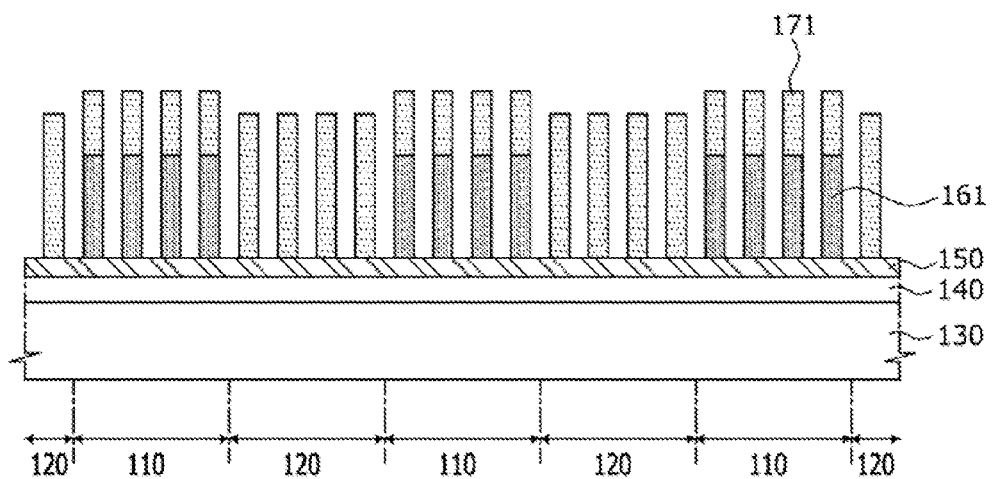

Referring to FIGS. 16 and 17, the second polymer blocks (172 of FIGS. 14 and 15) having the second phase and formed in the first and second regions 110 and 120 and the first polymer blocks (162 of FIGS. 14 and 15) having the second phase and formed in the first regions 110 may be removed. As a result, only the first polymer blocks 161 and the second polymer blocks 171 having the first phase may remain on the neutral layer 150 in the first regions 110 and only the second polymer blocks 171 having the first phase may remain on the neutral layer 150 in the second regions 110. The second polymer blocks 172 having the second phase and formed in the first and second regions 110 and 120 and the first polymer blocks 162 having the second phase and formed in the first regions 110 may be removed using an ultraviolet (UV) irradiation process and a development process.

Figure 18:
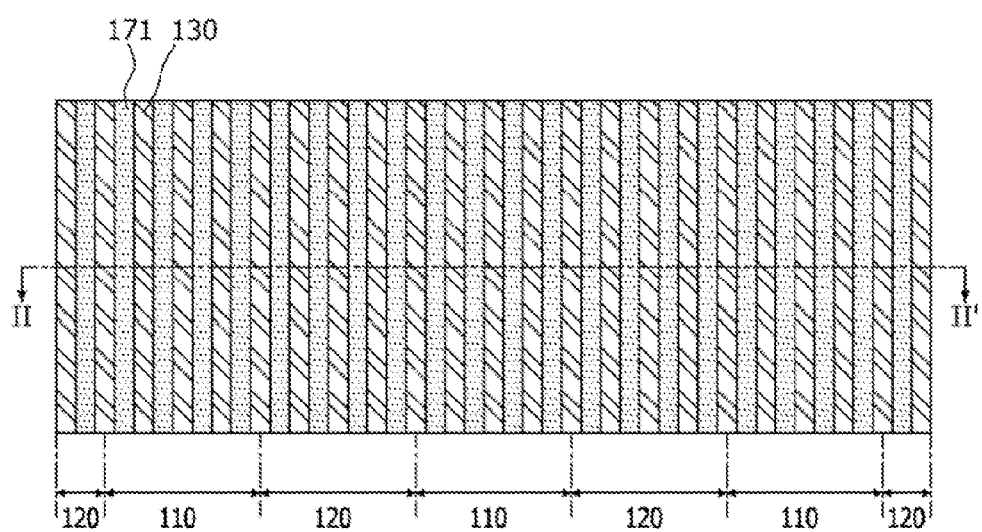
Figure 19:
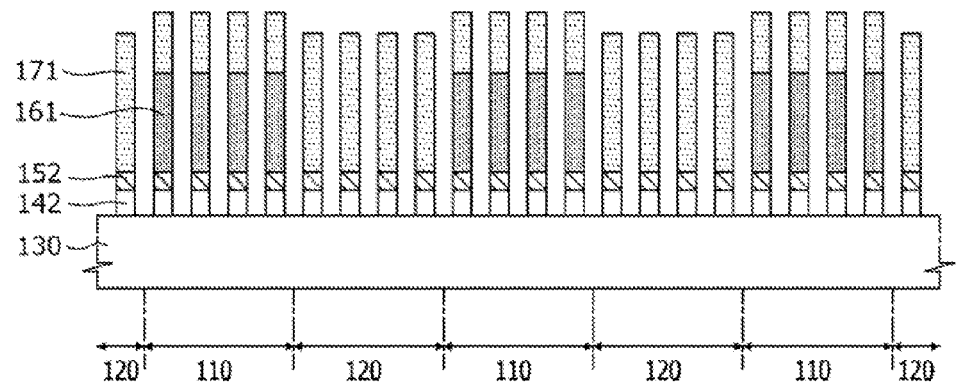

Referring to FIGS. 18 and 19, the neutral layer 150 and the pattern formation layer 140 may be etched using the second polymer blocks 171 and the first polymer blocks 161 having the first phase as etch masks to form neutral patterns 152 and target patterns 142 on the substrate 130.

Figure 20:
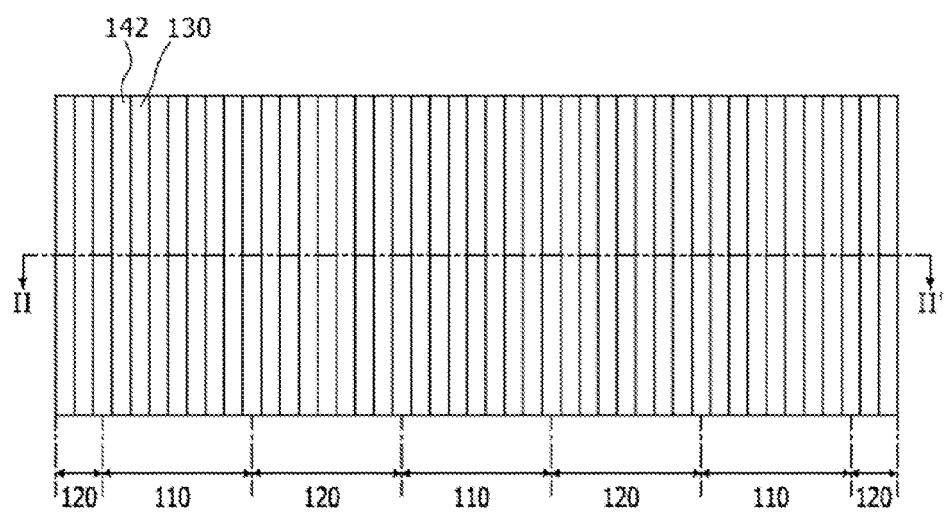
Figure 21:
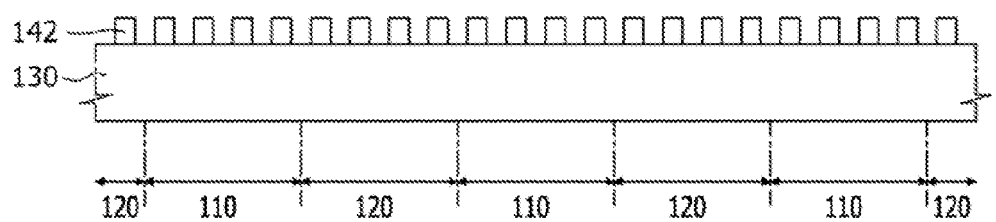

Referring to FIGS. 20 and 21, the second polymer blocks 171 and the first polymer blocks 161 having the first phase may be removed to expose top surfaces of the neutral patterns 152, and the neutral patterns 152 may then be removed to leave the target patterns 142 having a line and space form on the substrate 130.

In the above embodiment, the pattern size of the first block copolymer layer 165 may be controlled by the guide patterns 180 or the first openings 182. See FIGS. 5 and 7. If the first opening 182 is too big and thus the first block copolymer layer 165 is formed in a large size, pattern uniformity of the first polymer blocks 161 having a first phase and first polymer blocks 162 having a second phase which are obtained by the phase separation deteriorates. Thus, using a two-layered or a multi-layered block copolymer is more advantageous comparing with using a single-layered block copolymer in forming a large scale of line-space pattern with high uniformity. In the above embodiment, two-layered block copolymers 165 and 175 are employed. Each individual block copolymers 165 and 175 is initially shaped in a relatively small width. Thus, uniformity of the patterns obtained by phase separation can be enhanced. Then, the patterns 161, 162, 171, 172 obtained by phase separation collectively form a large scale of line-space pattern. See FIG. 15.

Referring to FIG. 15, it is found that upon phase separation, each edge patterns 161, 162, 171, 172 obtained by phase separation is formed a half size of the inner patterns 161, 162, 171, 172 obtained by phase separation, See FIG. 15. Owing to this feature, a two-layered or a multi-layered block copolymer structure can form a collective line-space pattern which is continuous and unit burn over a large area.

According to the embodiments set forth above, pattern structures fabricated to have a line and space form using a block copolymer material may be provided. The embodiments may be used in fabrication of polarizing plates or in formation of a reflective lens of reflective liquid crystal display (LCD) units. The embodiments may also be used in fabrication of separate polarizing plates as well as in formation of polarizing pans including display panels. For example, the embodiments may be used in fabrication of array substrates including thin film transistors or in processes for directly forming the polarizing parts on color filter substrates. Further, the embodiments may be used in molding processes for fabricating nanowire transistors or memories, electronic/electric components such as nano-scaled interconnections, catalysts of solar cells and fuel cells, etch masks, organic light emitting diodes (OLEDs), and gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single chip package form or in a multi-chip chip package form. The IC chips may be integrated in intermediate products such as mother boards or end products to constitute signal processing devices. The end products may include toys low-end application products, or high-end application products such as computers. For example, the end products may include display units, keyboards, or central processing units (CPUs).

The embodiments disclosed above are fir illustrative purposes. Those skilled in the art will appreciate that various modifications, additions and substitutions are possible.

What is claimed is:

1. A method of fabricating a pattern, the method comprising:
   sequentially forming a pattern formation layer and a neutral layer over a substrate in a first region and a second region;
   forming guide patterns over the neutral layer in the second region;
   forming a first block copolymer layer over the neutral layer in the first region;
   phase-separating the first block copolymer layer to form first polymer blocks having a first phase and first polymer blocks having a second phase;
   removing the guide patterns to form openings, wherein the neutral layer is exposed by the openings in the second region and the first polymer blocks remain in the first region;
   forming a second block copolymer layer over the phase-separated first block copolymer layer and in the openings;
   phase-separating the second block copolymer layer to form second polymer blocks having the first phase and second polymer blocks having the second phase;
   removing the second polymer blocks having the second phase and the first polymer blocks having the second phase; and
   etching the neutral layer and the pattern formation layer using the first polymer blocks having the first phase and the second polymer blocks having the first phase as an etch mask.

2. The method of claim 1, wherein the first region and the second region are alternately repeated in a first direction parallel with a top surface of the substrate.

3. The method of claim 1, wherein the guide patterns include a negative photoresist layer.

4. The method of claim 1, wherein the guide patterns include a positive photoresist layer.

5. The method of claim 4, further comprising applying a blank exposure process to the guide patterns.

6. The method of claim 1, wherein phase-separating the first block copolymer layer is performed such that the first polymer blocks having the second phase are disposed at edges of the first region.

7. The method of claim 6, wherein a width of the respective first polymer blocks having the second phase and disposed at the edges of the first region is substantially half of a width of the respective first polymer blocks having the second phase and disposed in an inner portion of the first region.

8. The method of claim 7,
   wherein a width of the first region is $(2 \times N' \times W')$; and
   wherein $N'$ denotes the number of the first polymer blocks having the first phase and disposed in the first region and $W'$ denotes a width of the first polymer blocks having the second phase and disposed in an inner portion of the first region.

9. The method of claim 1, wherein phase-separating the second block copolymer layer is performed such that the second polymer blocks having the second phase are disposed at edges of the second region.

10. The method of claim 9, wherein a width of the respective second polymer blocks having the second phase and disposed at the edges of the second region is substantially half of a width of the respective second polymer blocks having the second phase and disposed in an inner portion of the second region.

11. The method of claim 10,
    wherein a width of the second region is $(2 \times N'' \times W'')$; and
    wherein $N''$ denotes the number of the second polymer blocks having the first phase and disposed in the second region and $W''$ denotes a width of the second polymer blocks having the second phase and disposed in an inner portion of the second region.

12. The method of claim 1,
    wherein phase-separating the second block copolymer layer is performed such that the second polymer blocks having the first phase are aligned with the first polymer blocks having the first phase in the first region, respectively, and the second polymer blocks having the second phase are aligned with the first polymer blocks having the second phase in the first region, respectively.

13. A method of fabricating a pattern, the method comprising:
    forming a first block copolymer layer over a substrate in a first region;

phase-separating the first block copolymer layer to form first polymer blocks having a first phase and first polymer blocks having a second phase;

forming a second block copolymer layer over the first polymer blocks having a first phase and the first polymer blocks having a second phase in the first region, and further forming the second block copolymer layer over the substrate in a second region;

phase-separating the second block copolymer layer to form second polymer blocks having the first phase and second polymer blocks having the second phase;

removing the second polymer blocks having the second phase and the first polymer blocks having the second phase to expose an underlying layer; and patterning the underlying layer using the first polymer blocks having the first phase and the second polymer blocks having the first phase as an etch mask.

14. The method of claim 13, wherein the underlying layer is a pattern formation layer provided from between the substrate and the first block copolymer layer in the first region to between the substrate and the second block copolymer in the second region.

15. The method of claim 14, further comprising:
forming a neutral layer from between the pattern formation layer and the first block copolymer layer in the first region to between the pattern formation layer and the second block copolymer layer in the second region, and patterning the neutral layer using the first polymer blocks having the first phase and the second polymer blocks having the first phase as an etch mask.

16. The method of claim 15, further comprising forming guide patterns over the neutral layer in the second region.

17. The method of claim 13, wherein the underlying layer is the substrate.

18. The method of claim 13,
wherein the phase-separating of the first block copolymer layer is performed by annealing, and
wherein the phase-separating of the second block copolymer layer is performed by annealing.

19. The method of claim 13, wherein, upon phase-separation, the second polymer blocks having the first phase and the second polymer blocks having the second phase are vertically aligned with the first polymer blocks having the first phase and the first polymer blocks having the second phase, respectively.

20. A method for forming an electronic device comprising:
forming a first block copolymer layer over a substrate in a first region;

phase-separating the first block copolymer layer to form first polymer blocks having a first phase and first polymer blocks having a second phase;

forming a second block copolymer layer over the first polymer blocks having a first phase and the first polymer blocks having a second phase in the first region, and further forming the second block copolymer layer over the substrate in a second region;

phase-separating the second block copolymer layer to form second polymer blocks having the first phase and second polymer blocks having the second phase;

removing the second polymer blocks having the second phase and the first polymer blocks having the second phase to expose an underlying layer; and patterning the underlying layer using the first polymer blocks having the first phase and the second polymer blocks having the first phase as an etch mask, wherein the electronic device includes a reflective lens of a reflective liquid crystal display (LCD) unit, a polarizing plate for a display panel, a thin film transistor, a color filter substrate, a nano-wire transistor, a memory device, a logic device, a nano-scaled interconnection component, a solar cell, a fuel cell, an etch mask, an organic light emitting diodes (OLEDs), a gas sensor, or an integrated circuit (IC) chip, wherein the integrated circuit (IC) chip includes an IC chip in a raw wafer form, in a bare die form, in a package form, in a single chip package form or in a multi-chip package form, a mother board, or a signal processing device, wherein the single processing device includes a toy, a computer, a display unit, a keyboard, or a central processing unit (CPU), wherein the memory device includes a dynamic random access memory (DRAM) device, a static random access memory (SRAM) device, a flash memory device, a magnetic random access memory (MRAM) device, a phase changeable random access memory (PcRAM) device, a resistive random access memory (ReRAM) device or a ferroelectric random access memory (FeRAM) device, and wherein the logic device includes a controller or a microprocessor.

* * * * *